United States Patent
Natori et al.

(10) Patent No.: US 7,635,891 B2
(45) Date of Patent: Dec. 22, 2009

(54) SEMICONDUCTOR DEVICE

(75) Inventors: Katsuaki Natori, Yokohama (JP);
Katsuyuki Sekine, Yokohama (JP);
Daisuke Nishida, Yokohama (JP); Ryota Fujitsuka, Yokohama (JP); Masayuki Tanaka, Yokohama (JP); Kazuaki Nakajima, Tokyo (JP); Yoshio Ozawa, Yokohama (JP); Akihito Yamamoto, Naka-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/946,606

(22) Filed: Nov. 28, 2007

(65) Prior Publication Data
US 2008/0149932 A1 Jun. 26, 2008

(30) Foreign Application Priority Data
Nov. 30, 2006 (JP) .............................. 2006-324472

(51) Int. Cl.
*H01L 27/115* (2006.01)
(52) U.S. Cl. .................. 257/324; 257/66; 257/314; 257/315; 257/E27.103; 257/E29.3
(58) Field of Classification Search ................. 257/66, 257/314–315, 324, E27.103, E29.3
See application file for complete search history.

(56) References Cited

U.S. PATENT DOCUMENTS

2005/0199956 A1* 9/2005 Ding .......................... 257/365
2006/0166421 A1* 7/2006 Kamioka et al. ............ 438/197
2007/0029603 A1* 2/2007 Lee et al. .................... 257/315
2007/0099363 A1 5/2007 Nakajima et al.

FOREIGN PATENT DOCUMENTS

| JP | 2000-101052 | | 4/2000 |
| JP | 2000-200841 | * | 7/2000 |
| JP | 2005-129942 | | 5/2005 |
| KR | 10-2003-0080239 | | 10/2003 |
| KR | 10-2006-0033500 | | 4/2006 |

OTHER PUBLICATIONS

Notification for Filing Opinion mailed Sep. 29, 2008, from the Korean Patent Office in counterpart Korean Application No. 10-2007-122539.

* cited by examiner

*Primary Examiner*—Cuong Q Nguyen
*Assistant Examiner*—Trang Q Tran
(74) *Attorney, Agent, or Firm*—Finnegan, Henderson, Farabow, Garrett & Dunner, L.L.P.

(57) ABSTRACT

A semiconductor device includes a semiconductor substrate, and a memory cell array provided on the semiconductor substrate and including a plurality of memory cells arranged on the semiconductor substrate, each of the plurality of the memory cells including a first insulating film provided on the semiconductor substrate, a charge storage layer provided on the first insulating film, a second insulating film provided on the charge storage layer, and a control electrode containing metal or metal silicide provided on the charge storage layer via the second insulating film, wherein a corner of a lower part of the control electrode includes semiconductor and fails to contain the metal or the metal silicide in a channel width direction view of the memory cell.

20 Claims, 8 Drawing Sheets

SEMICONDUCTOR DEVICE

CROSS-REFERENCE TO RELATED APPLICATIONS

This application is based upon and claims the benefit of priority from prior Japanese Patent Application No. 2006-324472, filed Nov. 30, 2006, the entire contents of which are incorporated herein by reference.

BACKGROUND OF THE INVENTION

1. Field of the Invention

The present invention relates to a semiconductor device comprising a control electrode containing metal or metal silicide.

2. Description of the Related Art

Recently, as a LSI is becoming higher in density, a capacitor insulating film and a gate insulating film are going on thinning. In order to avoid increasing of leakage current caused by the thinning, attempts such as introducing a three dimensional structure cell or an insulating film having a high dielectric constant are made.

For example, in the case of a flash memory, a high dielectric constant film, such as an ONO film (three-layer lamination film of silicon oxide film/silicon nitride film/silicon oxide film) or an $Al_2O_3$ film is used as an insulating film (inter-gate electrode insulating film) provided between a floating gate electrode and a control gate electrode, and an area of the inter-gate electrode insulating film is increased by introducing the three dimensional structure to the memory cell, thereby, an electric field applied to the inter-gate electrode insulating film is suppressed and the increasing of the leakage current is suppressed.

However, according to the thinning of the inter-gate electrode insulating film accompanied with the further miniaturization (subsequent to the half-pitch 32-nm generation), the following problem is becoming not negligible. That is, the electric field concentrates at the corner of the lower part of the control gate electrode, and it causes problems that a break down voltage of the inter-gate electrode insulating film at the lower part corner is insufficient and the increasing of the leakage current is not negligible (Jpn. Pat. Appln. KOKAI Publication No. 2000-200841).

BRIEF SUMMARY OF THE INVENTION

According to an aspect of the present invention, there is provided a semiconductor device comprising: a semiconductor substrate; and a memory cell array provided on the semiconductor substrate and including a plurality of memory cells arranged on the semiconductor substrate, each of the plurality of the memory cells comprising: a first insulating film provided on the semiconductor substrate; a charge storage layer provided on the first insulating film; a second insulating film provided on the charge storage layer; and a control electrode containing metal or metal silicide provided on the charge storage layer via the second insulating film, wherein a corner of a lower part of the control electrode comprises semiconductor and fails to contain the metal or the metal silicide in a channel width direction of the memory cell.

According to another aspect of the present invention, there is provided a semiconductor device comprising: a semiconductor substrate; and a memory cell array provided on the semiconductor substrate and including a plurality of memory cells arranged on the semiconductor substrate, each of the plurality of the memory cells comprising: a first insulating film provided on the semiconductor substrate; a charge storage layer provided on the first insulating film; a second insulating film provided on the charge storage layers; and a control electrode containing metal or metal silicide provided on the charge storage layer via the second insulating film, wherein the control electrode includes a part contacting the second insulating film, and the part contacting the second insulating film comprises semiconductor and fails to contain the metal or the metal silicide.

DETAILED DESCRIPTION OF THE INVENTION

Embodiments of the present invention will be described with reference to the accompanying drawings.

FIGS. 1 to 14 are cross-sectional views showing a method for fabricating a semiconductor device according to an embodiment. The semiconductor device of the present embodiment includes a flash memory. FIGS. 1 to 10 and 13 show the cross sections of the flash memory in a direction of a channel width of a plurality of memory cells constituting the flash memory. FIGS. 11 and 12 show cross sections of the memory cells forming the flash memory in a direction of a channel length of the memory cells constituting the flash memory.

Figure 1:
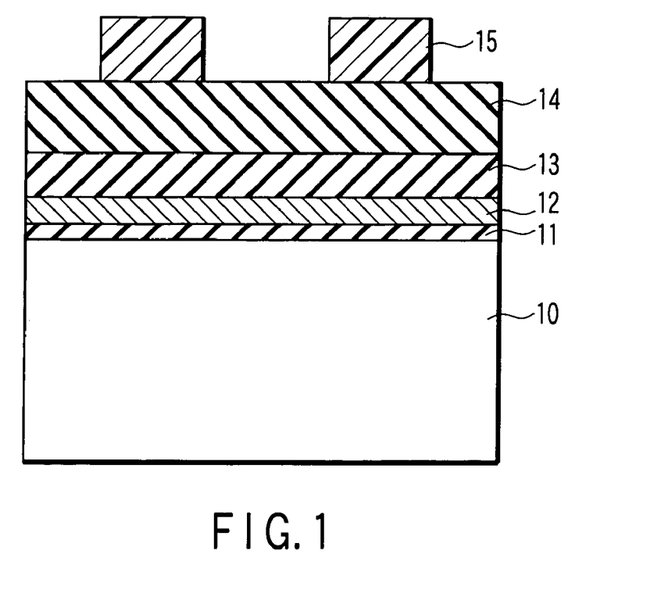
FIG. 1 is a cross-sectional view for explaining a semiconductor device fabricating method according to an embodiment.

[FIG. 1]

A tunnel insulating film 11 is formed on a p-type silicon substrate 10 (or p-type well formed in a surface of an n-type silicon substrate). The tunnel insulating film 11 is, for example, a tunnel oxide film having a thickness of approximately 1 to 15 nm.

A first conductive film 12 to be a part (lower part) of a floating gate electrode (charge storage layer) is formed on the tunnel insulating film 11 by CVD process. The thickness of the first conductive film 12 is within a range of approximately 10 to 200 nm. The first conductive film 12 is, for example, a polycrystalline silicon layer.

A silicon nitride film 13 and a silicon oxide film 14 are successively formed on the first conductive film 12 by CVD process. The thickness of the silicon nitride film 13 is within a range of approximately 50 to 200 nm. The thickness of the silicon oxide film 14 is within a range of approximately 50 to 400 nm.

A resist pattern 15 is formed on the silicon oxide film 14 by photolithography process.

Figure 2:
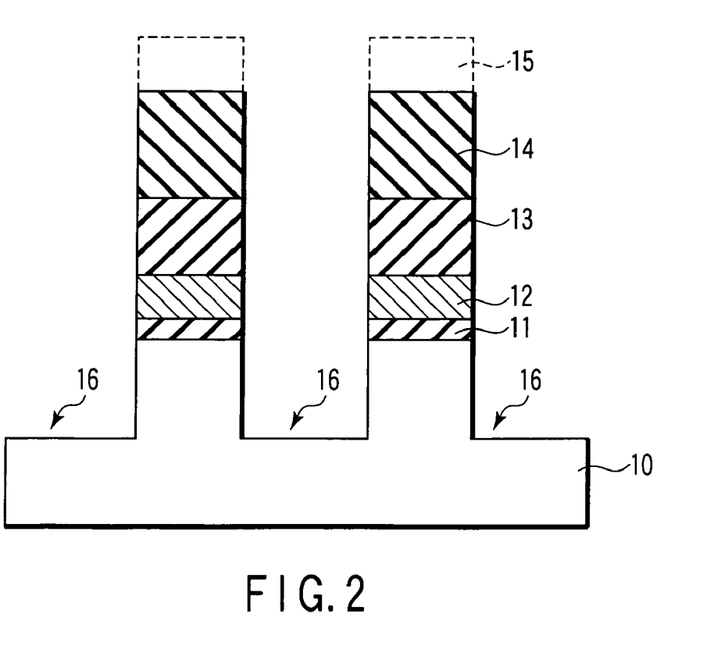
FIG. 2 is a cross-sectional view for explaining the semiconductor device fabricating method according to the embodiment following FIG. 1.

[FIG. 2]

A pattern of the resist pattern 15 is transferred onto the silicon oxide film 14 in a manner that the silicon oxide film 14 is etched by using the resist pattern 15 as a mask. Thereafter, the silicon nitride film 13, the first conductive film 12, the tunnel insulating film 11, and the silicon substrate 10 are successively etched by using the silicon oxide film 14 as a mask, so that shallow trench 16 is formed. Following the etching, a high temperature post oxidization process is carried out for repairing the damage to the cross section of the structure formed by the etching. As a result, a silicon oxide film (not shown) is formed on bottom and side faces of the shallow trench, which are a surface of the silicon substrate 10.

Figure 3:
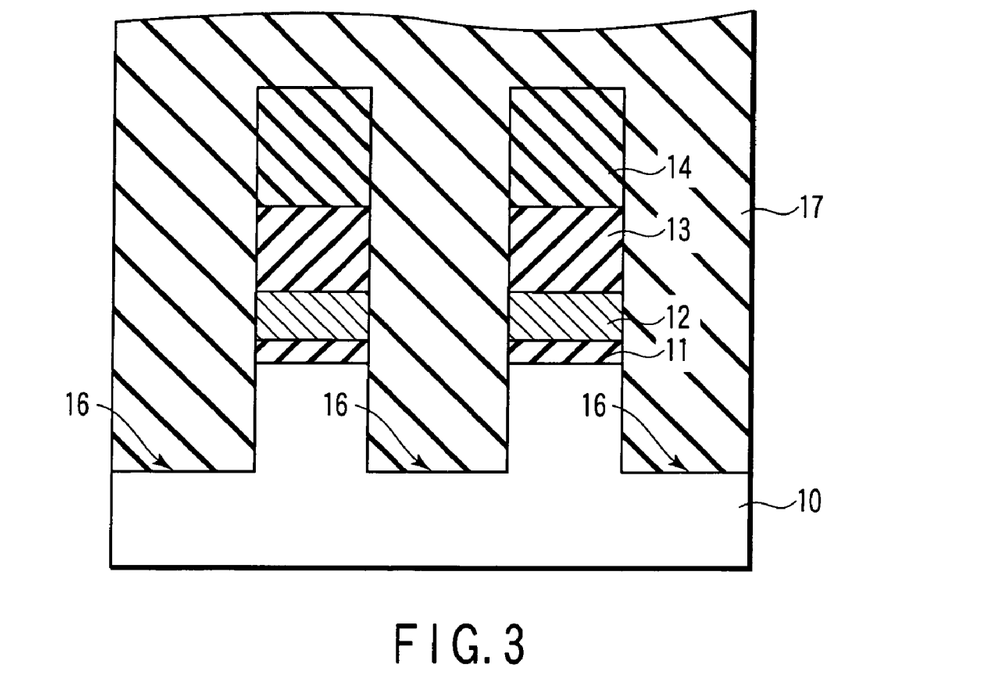
FIG. 3 is a cross-sectional view for explaining the semiconductor device fabricating method according to the embodiment following FIG. 2.

[FIG. 3]

An isolation insulating film 17 is formed over the entire surface so that the isolation insulating film 17 fills the shallow trench 16. The thickness of the isolation insulating film 17 is approximately 200 to 1500 nm. Here, the isolation insulating film 17 is a silicon oxide film, but it may be another insulating film. A density of the isolation insulating film 17 is increased by high-temperature heat treatment in a nitrogen or oxygen atmosphere (high density process).

Figure 4:
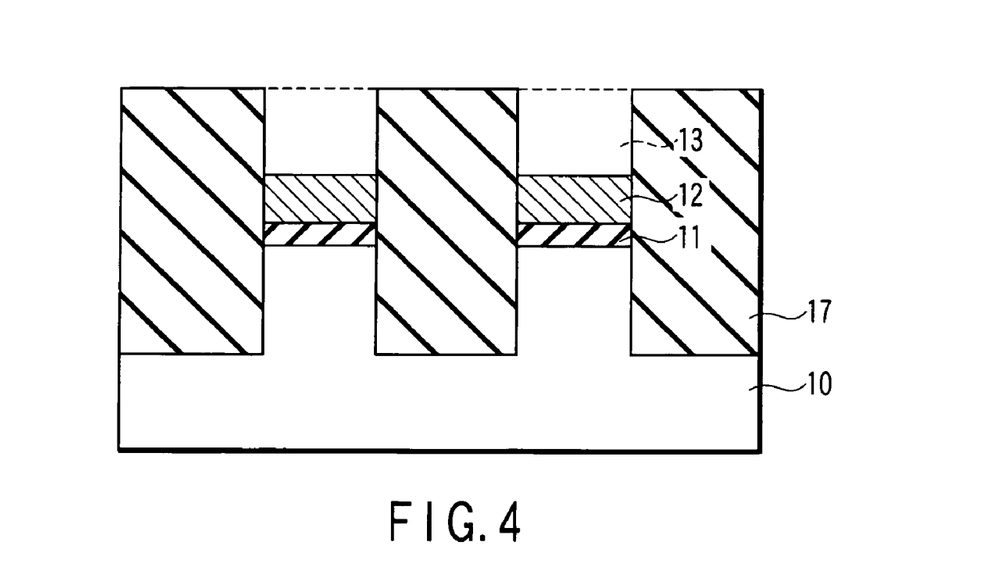
FIG. 4 is a cross-sectional view for explaining the semiconductor device fabricating method according to the embodiment following FIG. 3.

[FIG. 4]

A surface of the structure is planarized by chemical mechanical polishing (CMP) process, using the silicon nitride film 13 as a stopper. Thereafter, the silicon nitride film 13 is removed by using a solution allowing selective etching to a silicon oxide film, for example, hot phosphoric acid.

In the present embodiment, when the STI (shallow trench isolation) is formed, the laminated film of the silicon nitride film 13 and the silicon oxide film 14 is used as the mask. But any of a single layer of the silicon nitride film, a single layer of the silicon oxide film, or another single layer and/or a multiple layer of the insulating film may be used as a mask if an etching ratio of it to the silicon is secured by appropriately selecting the film thickness and the reactive ion etching condition.

Figure 5:
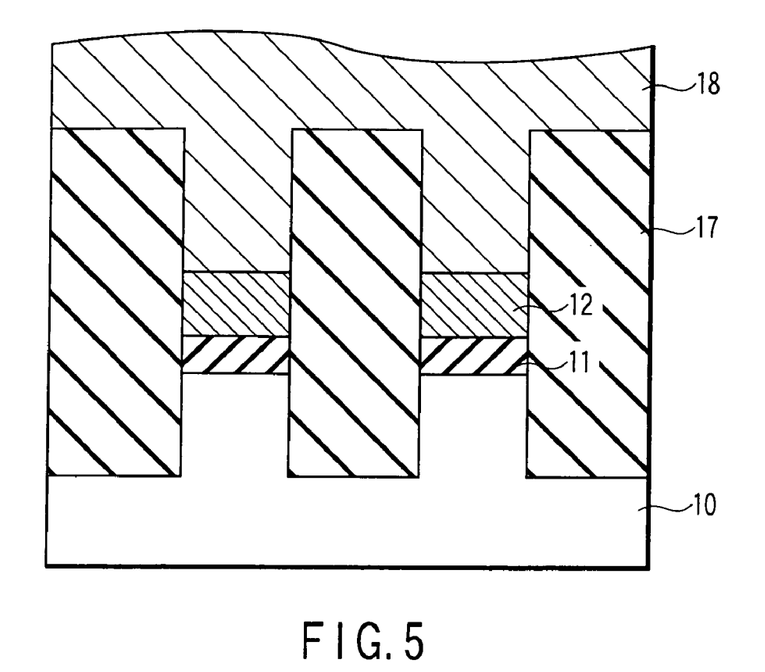
FIG. 5 is a cross-sectional view for explaining the semiconductor device fabricating method according to the embodiment following FIG. 4.

[FIG. 5]

A second conductive film 18 forming a part (upper part) of the floating gate electrode is formed on the entire surface by a process excellent in step coverage, such as CVD process, so that it fills the trench formed after the silicon nitride film 13 is removed. The second conductive film 18 is thicker than the first conductive film 12. The second conductive film 18 is a polycrystalline silicon film, for example.

Figure 6:
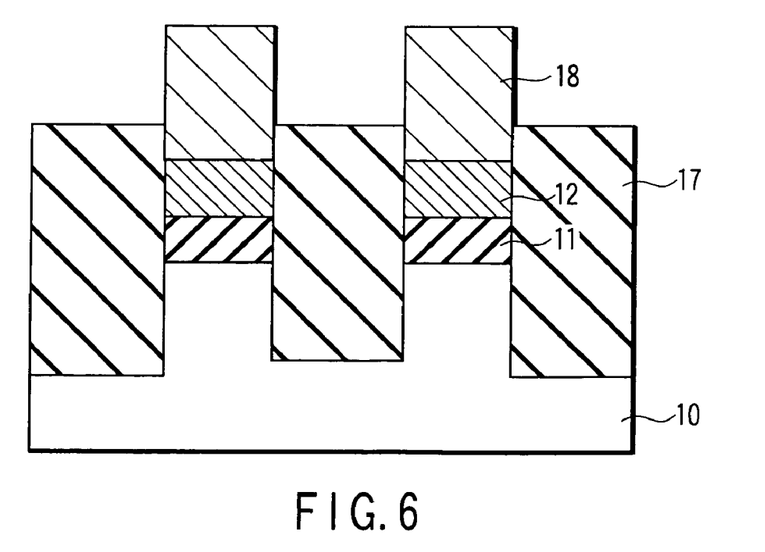
FIG. 6 is a cross-sectional view for explaining the semiconductor device fabricating method according to the embodiment following FIG. 5.

[FIG. 6]

The surface (the second conductive film 18 and the isolation insulating film 17) is planarized by CMP process by using the isolation insulating film 17 as a stopper, thereafter, by a method allowing selective etching to a silicon nitride film, the isolation insulating film 17 is selectively reduced in height to expose the side surface of the second conductive film 18 at portions other than its lower part. The etching process may be a wet etching process or dry etching process.

Figure 7:
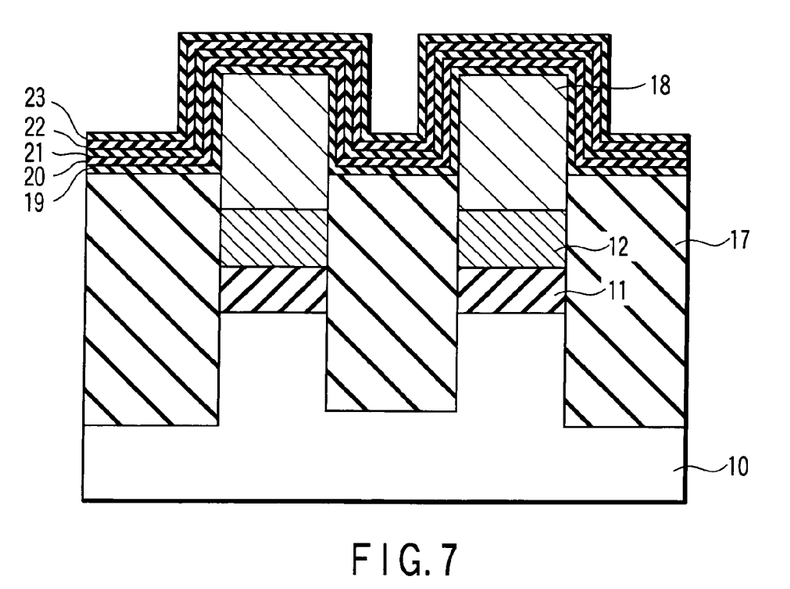
FIG. 7 is a cross-sectional view for explaining the semiconductor device fabricating method according to the embodiment following FIG. 6.

[FIG. 7]

An inter-gate electrode insulating film 19 to 23 having multiple structure, which has a dielectric constants higher than a silicon oxide film, is formed on a top surface and a side surfaces of the second conductive film 18.

Specifically, a silicon nitride film 19 (1 to 5 nm thick), a silicon oxide film 20 (1 to 5 nm thick), an $Al_2O_3$ film 21 (1 to 10 nm) as a high dielectric constant film, a silicon oxide film 22 (1 to 5 nm thick), and a silicon nitride film 23 (1 to 5 nm thick) are successively formed. The thicknesses of the film 19 to 23 is appropriately selected according to the performance of the semiconductor device. A single layer or a multiple layer having higher dielectric constant than the silicon nitride film may be used instead of the inter-gate electrode insulating film 19 to 23.

In the present embodiment, the $Al_2O_3$ film 21 is used as the high-dielectric-constant film, however other high-dielectric-constant film, for example, any single layer of a magnesium oxide (MgO) film having a relative dielectric constant of about 10, an yttrium oxide ($Y_2O_3$) film having a relative dielectric constant of about 16, a hafnia ($HfO_2$) film, a zirconium oxide ($ZrO_2$) film or a lanthanum oxide ($La_2O_3$) film having a relative dielectric constant of about 22 may be used. Further, a ternary compound insulating film, such as a hafnium silicate (HfSiO) film or a hafnium aluminate (HfAlO) may also be used. That is, an oxide or a nitride containing at least one of silicon (Si), aluminum (Al), magnesium (Mg), yttrium (Y), hafnium (Hf), zirconium (Zr), and lanthanum (La) may be used.

In addition, in the present embodiment, the structure of the inter-gate electrode insulating film is the lamination structure of silicon nitride film/silicon oxide film/high-dielectric-constant film/silicon oxide film/silicon nitride film, however other structure, for example, a lamination structure of silicon oxide film/silicon nitride film/silicon oxide film or a lamination structure of silicon nitride film/silicon oxide film/silicon nitride film/silicon oxide film/silicon nitride film may be properly selected according to the performances of the semiconductor device. Further a single layer may be used. When the floating gate electrode and the control gate electrode comprise polycrystalline silicon films, the inter-gate electrode insulating film is also called an interpoly insulating film.

Figure 8:
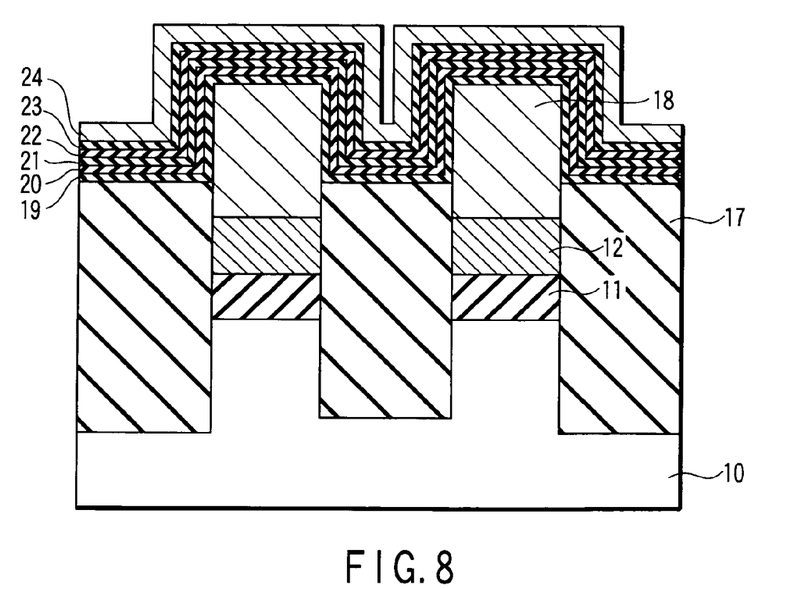
FIG. 8 is a cross-sectional view for explaining the semiconductor device fabricating method according to the embodiment following FIG. 7.

[FIG. 8]

A polycrystalline silicon film 24 is formed on the silicon nitride film 23. The thickness of the polycrystalline silicon film 24 is 10 nm, for example.

Figure 9:
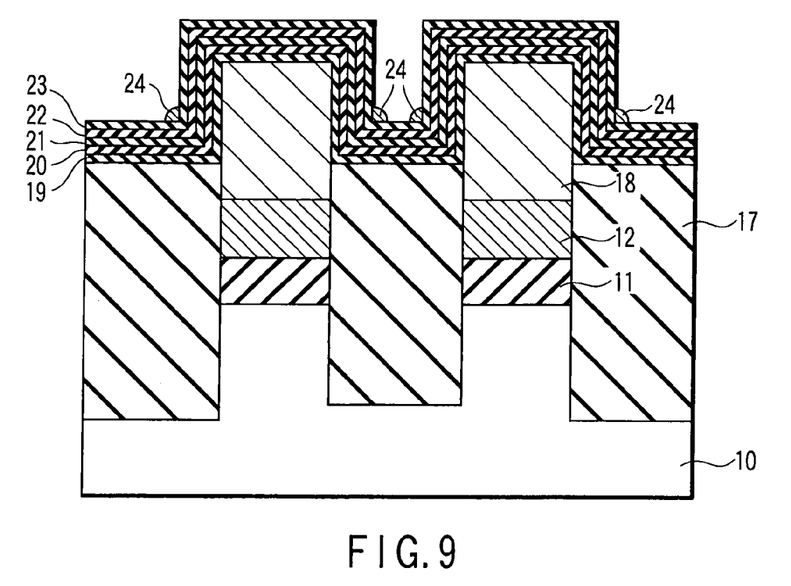
FIG. 9 is a cross-sectional view for explaining the semiconductor device fabricating method according to the embodiment following FIG. 8.

[FIG. 9]

The polycrystalline silicon film 24 is selectively and anisotropically etched, thereby the polycrystalline silicon film 24 constituting a part of the control gate electrode (electric field concentration reducing member) is remained at the corners of the lower part bottoms of the inter-gate electrode insulating film 19 to 23 sandwich between second conductive films (floating gate electrodes) 18, that is, the parts where the electric field concentrates.

The etching is carried out by using reactive ion etching (RIE), the conditions is, for example, the etching time is selected to be 3 to 5 times of the usual etching time in the RIE sidewall remaining conditions.

The polycrystalline silicon film 24 may be remained at a part of the top surface of the inter-gate electrode insulating film 19 to 23, in addition to the corners of the bottom of the lower parts of the inter-gate electrode insulating film 19 to 23.

Thereafter, a thin oxide film (not shown) is formed on the surface of the polycrystalline silicon film 24. This oxide film has a thickness which allows electrical connection between the polycrystalline silicon film 24 and a control gate electrode 29 formed in a step of FIG. 14.

The oxide film is formed by immersing the substrate in pure water containing 5 ppm of $O_3$ for 30 minutes. The oxide film (reaction preventing film) is provided for preventing a reaction (silicidation) between the polycrystalline silicon film 24 and a Co film 28 formed in a step of FIG. 10.

The fabricating method of the present embodiment includes the special step for forming the oxide film (reaction preventing film), however, when a native oxide film formed on the surface of the polycrystalline silicon film 24 is used as the oxide film (reaction preventing film), the special step may be omitted.

Figure 10:
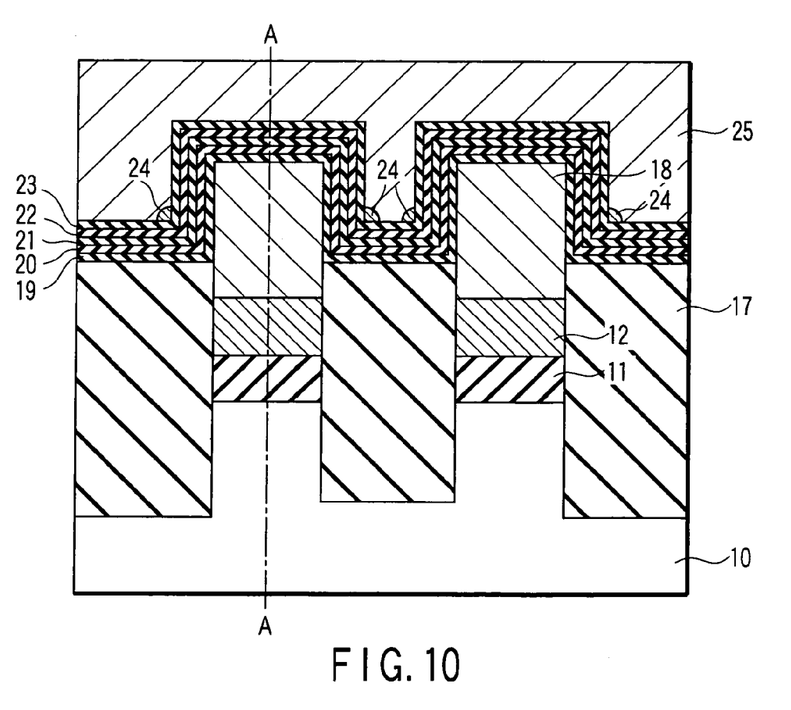
FIG. 10 is a cross-sectional view for explaining the semiconductor device fabricating method according to the embodiment following FIG. 9.
Figure 11:
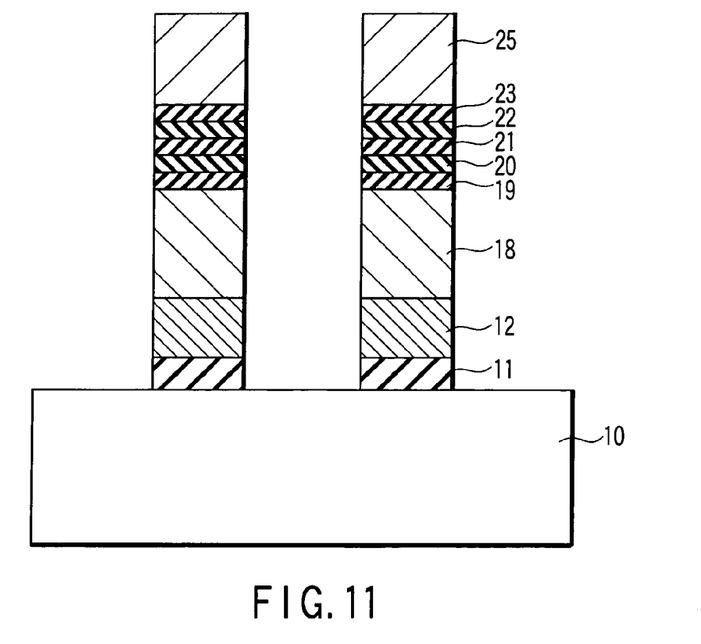
FIG. 11 is a cross-sectional view for explaining the semiconductor device fabricating method according to the embodiment following FIG. 10.
Figure 12:
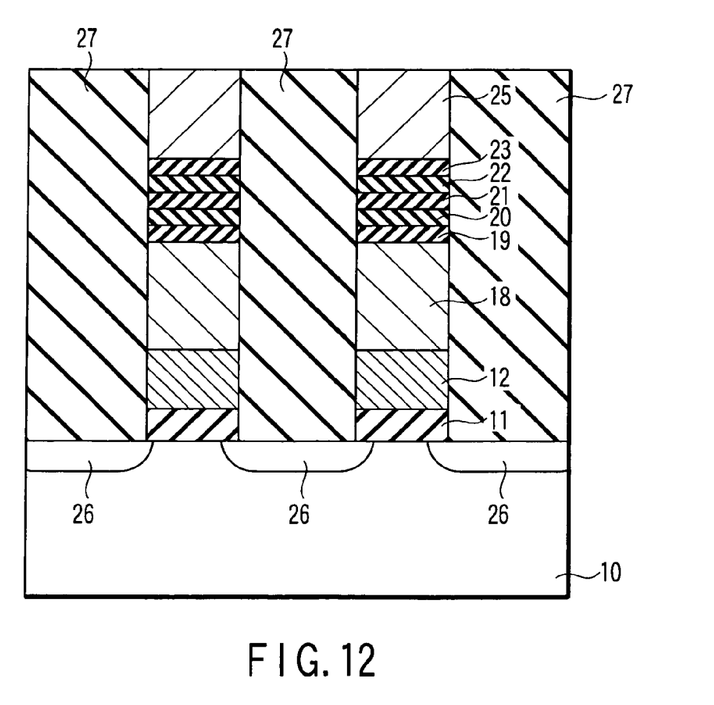
FIG. 12 is a cross-sectional view for explaining the semiconductor device fabricating method according to the embodiment following FIG. 11.

[FIGS. 10 and 11]

A polycrystalline silicon film 25 to be a control gate electrode is formed, thereafter, the polycrystalline silicon film 25 is processed into control gate electrode shape by lithography process and etching process (e.g., RIE process). The thickness of the polycrystalline silicon film 25 is, for example, 40 nm. FIG. 11 is a cross-sectional view taken along line A-A in FIG. 10 (cross-section of the channel length direction).

Here, the etching process of the polycrystalline silicon film 24 in FIG. 9 is carried out in an etching apparatus, and the polycrystalline silicon film 25 in FIGS. 10 and 11 is formed in a film forming apparatus. Therefore, when the substrate is moved from the etching apparatus to the film forming apparatus, a native oxide film can be formed on the surface of the polycrystalline silicon film 24. Thus, the thin oxide film (reaction preventing film) can be formed without using the method in which the substrate is immersed in pure water containing 5 ppm of $O_3$ for 30 minutes.

[FIG. 12]

A pair of source-drain regions 26 is formed in a self-align manner by introducing n-type impurities into the surface of the p-type silicon substrate 10 using the gate structures 11, 12, 18 to 23, and 25 as a mask, and then performing a heat treatment. In this way, memory cells are formed. In FIG. 12, only two memory cells are illustrated for ease of illustration, but, actually, a number of memory cells correspond to a storage capacity are formed, and the memory cell array comprising arranged plurality of the memory cells is obtained.

An insulating film is formed on the entire surface such that it fills between the gate structures 11, 12, 18 to 23 and 25, thereafter, this insulating film is polished by CMP process so that the surface of the polycrystalline silicon 25 is exposed, thereby the surface (polycrystalline silicon film 25 and interlayer insulating film 27) is planarized.

Figure 13:
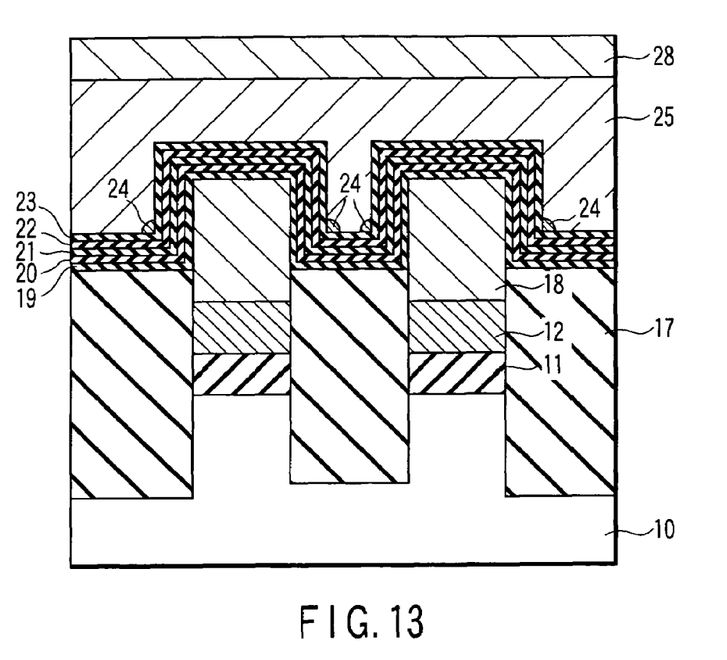
FIG. 13 is a cross-sectional view for explaining the semiconductor device fabricating method according to the embodiment following FIG. 12.

[FIG. 13]

A cobalt (co) film 28 is formed over the entire surface. The thickness of the Co film 28 is 10 nm for example.

Figure 14:
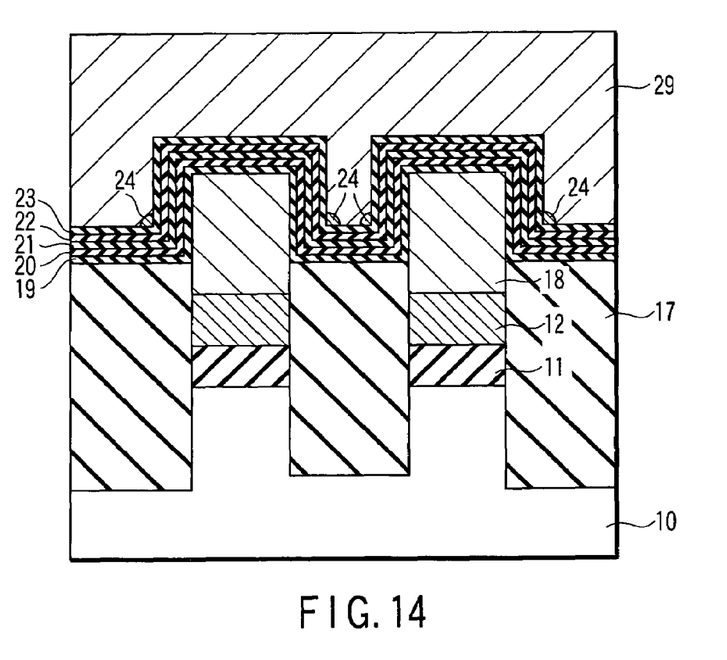
FIG. 14 is a cross-sectional view for explaining the semiconductor device fabricating method according to the embodiment following FIG. 13.

[FIG. 14]

The Co film 28 is reacted with the polycrystalline silicon film 25 by heat treatment, so that a control gate electrode (control electrode) 29 comprising cobalt silicide is formed.

At this time, as the thin oxide film or the native oxide film is formed on the surface of the polycrystalline silicon film 24, so that the reaction of the polycrystalline silicon film 24 with the Co film 28 is suppressed. Therefore, the polycrystalline silicon film 24 is remained at the corners after the step (silicidation) of FIG. 13.

According to the semiconductor device fabricating method of the present embodiment described above, the semiconductor device including the memory cell array in which the plurality of the memory cells are arranged, the memory cell comprising: the tunnel insulating film (first insulating film) 11 provided on a silicon substrate 10, the floating gate electrodes 12 and 18 provided on the tunnel insulating film 11, the inter-gate electrode insulating film (second insulating films) 19 to 23 provided on the floating gate films 12, 18, and a control gate electrode 29 containing the metal silicide and provided on the floating gate films 12, 18 via the inter-gate electrode insulating film 19 to 23, wherein the corners of the lower parts of the control gate electrode 29 comprises silicon (semiconductor) in the channel width direction of the memory cell is obtained. It will be understood that the fabricating method stated above is one of the fabricating methods for fabricating the semiconductor device of the embodiment, and the semiconductor device comprising the elements mentioned above is obtained by another fabricating method.

When the silicided electrode (fully silicided [FUSI]) is used as the control gate electrode as in the present embodiment, the decreasing of capacitance of the inter-gate electrode insulating film caused by depletion of the control gate electrode, is prevented, unlike the case where the polycrystalline silicon film is used.

In addition, as in the present embodiment, when the silicided electrode is used for the control gate, by forming the part of the inter-gate electrode insulating film where the local high electric field is applied (electrode corners), with the polycrystalline silicon film, the local high electric field applied to the electrode corners of the inter-gate electrode insulating film can be reduced.

Here, as the another structure for reducing the local high electric field, a structure for increasing thickness of the electrode corners of the inter-gate electrode insulating is considered. Concretely speaking, it is considered to a insulating film such as a $SiO_2$ film on the electrode corner. However, in the approach of forming the insulating films on the electrode corners, the capacitance is reduced in all the parts covered with the insulating films (reduction of the coupling ratio).

On the other hand, as in the present embodiment, when the polycrystalline silicon film is formed on the electrode corners, the depletion layer of the polycrystalline silicon film increases in accordance with the intensity of the electric field to reduce the electric field applied to the polycrystalline silicon film. When a negative voltage is applied to the control gate electrode, the polycrystalline silicon film 24 generates a depletion layer by the Schottky junction in the interface with the inter-gate electrode insulating film side. When a positive voltage is applied to the control gate electrode, the polycrystalline silicon film 24 generates the depletion layer in the interface side with the inter-gate electrode insulating film.

That is, by providing of the polycrystalline silicon film 24 on the areas including the electric field concentrated parts, the depletion layer of the polycrystalline silicon film 24 less expands on the flat part (with less electric field concentration) of the inter-gate electrode insulating film, and the depletion layer of the polycrystalline silicon film 24 more expands at the corner (with intensive electric field concentration) with increase of the intensity of the electric field, therefore, the electric field applied to the inter-gate electrode insulating film is reduced while sufficiently suppressing the capacitance decrease.

In this way, even if using the memory cell having the three dimensional structure, the characteristic of the inter-gate electrode insulating film is fully utilized, and finer memory cell, e.g., the memory cell subsequent to the half-pitch 32-nm generation, is easily realized.

FIG. 1 of Jpn. Pat. Appln. KOKAI Publication No. 2000-200841 shows a structure using the sidewall spacers made of insulating material in order to supplement the insufficient breakdown voltage and to suppress increasing of the leakage current. In the structure, the use of the spacers (insulating material) narrows the spaces each between the adjacent floating gate electrodes, so that the parasitic capacitance between the cells increases, causing interference between the cells. Therefore the structure of Jpn. Pat. Appln. KOKAI Publication No. 2000-200841 involves device characteristic degradation problem. On the other side, the structure using the polycrystalline silicon film 24 in the present embodiment, the polycrystalline silicon film 24 is conductive and blocks the electric field between the adjacent floating gate electrodes. Thereby, the inter-cell interference is suppressed and the device characteristic is improved.

It will be understood that the present invention is not limited to the embodiment mentioned above.

Figure 15:
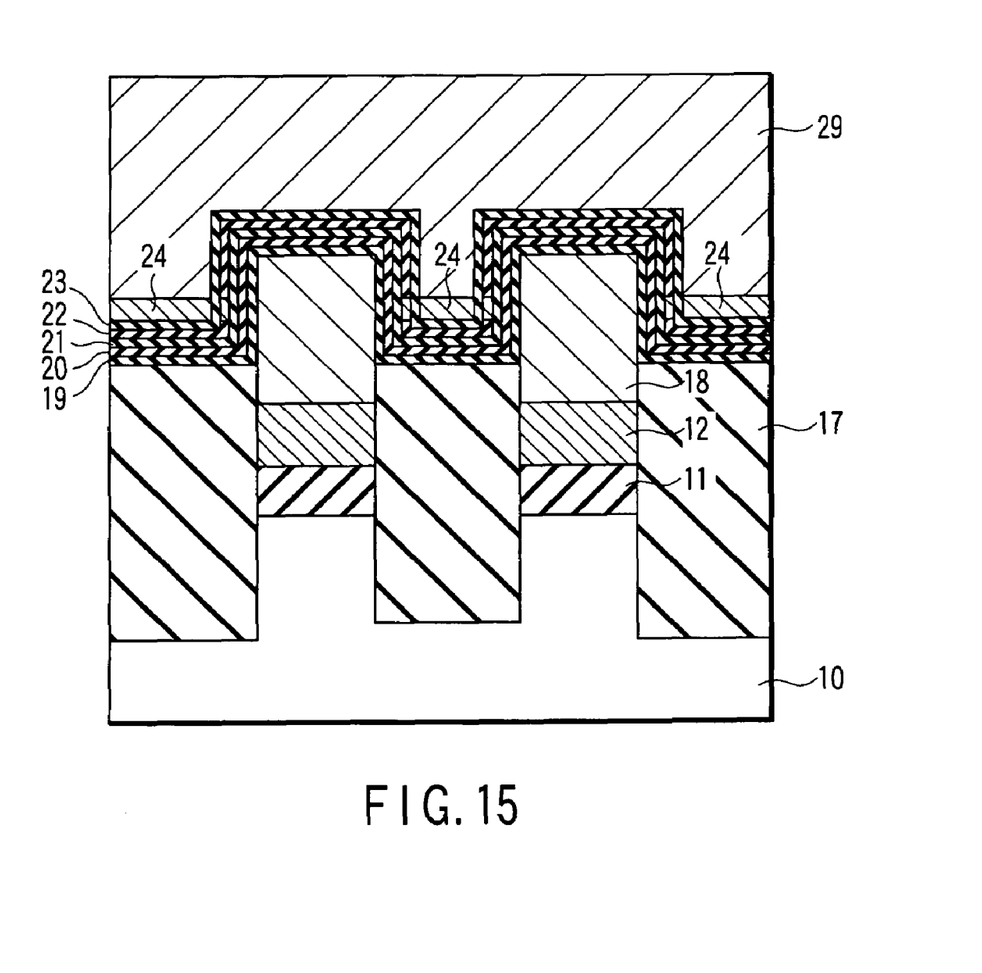
FIG. 15 is a cross-sectional view showing a semiconductor device structured according to another embodiment.

For example, in the present embodiment mentioned above, the corners of the lower parts of the control gate electrodes are made of the polycrystalline silicon film 24, however, as shown in FIG. 15, the structure that the bottom part of the control gate electrode 29 between the adjacent second conductive films 18 may be entirely made of the polycrystalline silicon film 24. The top surface of the polycrystalline silicon film 24 is lower than the top surface of the control gate electrode 29. Also in the structure of FIG. 15, the electric field concentrated at corner parts of the control gate electrode 29 at the time of cell write mode is suppressed. Because, the depletion layer expands in the polycrystalline silicon film 24 where the electric field concentrates. Thereby, the increasing of leakage current and the decreasing of breakdown voltage caused by the cell shape, are suppressed.

In addition, in the present embodiment, as the control gate electrode 29, the cobalt silicide electrode is used, however, instead of it, a metal silicide electrode comprising nickel silicide, platinum silicide or the like, a metal nitride electrode comprising TiN, TaN or the like, or a metal electrode comprising Al, W, Cu or the like, may be used, and same effect is obtained. In the case that the metal silicide electrode comprising nickel silicide, platinum silicide or the like is formed, a nickel film, a platinum film or the like is formed instead of the Co film 28 in the step of FIG. 13.

In addition, in the present embodiment, the polycrystalline silicon film 24 and the polycrystalline silicon film 25 are formed in the separate processing steps, however, by appropriately selecting the thicknesses of the polycrystalline silicon film 25 and the Co film 28 and the heat treatment condition, the structure described in the present embodiment may be formed by using only the polycrystalline silicon film 25, not forming the polycrystalline silicon film 24. For example, when the polycrystalline silicon film 25 of 20 nm thick, the Co film 28 of 10 nm thick are formed, and a heat treatment is carried out at 450° C. and for 15 seconds, the structure shown in FIG. 14 is obtained. In the case that film 28 is Ni, when the polycrystalline silicon film 25 of 30 nm thick, the Ni film of 15 nm are formed, and a heat treatment is carried out at 400° C. and for 30 seconds, the structure shown in FIG. 14 is also obtained.

In addition, the polycrystalline silicon film 24 is used as the electric field concentration reducing member, the crystal structure is not limited to the polycrystalline structure. Further, the semiconductor is not limited to silicon, but may be another semiconductor, for example, SiGe. The electric field concentration reducing member may contain n- or p-type dopant or not contain it.

The polycrystalline silicon film 24 may be provided on other locations than the lower part corners of the control gate electrode 29. The semiconductor device comprising the structured may be described as follows in general. That is, the semiconductor device comprises a memory cell array including a plurality of memory cells which are arranged, each memory cell comprising a first insulating film provided on a semiconductor substrate; charge storage layers provided on the first insulating film; second insulating films provided on the charge storage layers; and a control gate electrode containing metal or metal silicide, which is provided on the second insulating films on the charge storage layers, wherein a part of the control gate electrode contacting the second insulating film comprises semiconductor and the control gate electrode fails to contain metal silicide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate; and
a memory cell array provided on the semiconductor substrate and including a plurality of memory cells arranged on the semiconductor substrate,
each of the plurality of memory cells comprising:
a first insulating film provided on the semiconductor substrate;
a charge storage layer provided on the first insulating film;
a second insulating film provided on the charge storage layer; and
a control electrode provided on the charge storage layer via the second insulating film, the control electrode comprising first and second portions and both the first and second portions directly contacting the second insulating film, wherein the first portion is a corner of a lower part of the control electrode and comprises semiconductor and fails to contain metal or metal silicide in a channel width direction of the memory cell, and the second portion forms directly next to the first portion and is a part of the lower part of the control electrode except the first portion and comprises metal or metal silicide and fails to contain semiconductor.

2. The semiconductor device according to claim 1, wherein an entire lower part of the control electrode between adjacent charge storage layers comprises the semiconductor.

3. The semiconductor device according to claim 1, wherein the control electrode contains at least one of Co, Ni, Ti, Al, W, Cu and Pt.

4. The semiconductor device according to claim 1, wherein the first insulating film is a tunnel insulating film.

5. The semiconductor device according to claim 2, wherein the first insulating film is a tunnel insulating film.

6. The semiconductor device according to claim 1, wherein the second insulating film is a high dielectric constant film having a dielectric constant higher than a silicon oxide film.

7. The semiconductor device according to claim 2, wherein the second insulating film is a high dielectric constant film having a dielectric constant higher than a silicon oxide film.

8. The semiconductor device according to claim 1, wherein a material of the second insulating film is oxide or nitride containing at least one of silicon, aluminum, magnesium, yttrium, hafnium, zirconium or lanthanum.

9. The semiconductor device according to claim 2, wherein a material of the second insulating film is oxide or nitride containing at least one of silicon, aluminum, magnesium, yttrium, hafnium, zirconium and lanthanum.

10. The semiconductor device according to claim 1, wherein the memory cell array is a memory cell array of a flash memory.

11. The semiconductor device according to claim 2, wherein the memory cell array is a memory cell array of a flash memory.

12. The semiconductor device according to claim 1, wherein the semiconductor is polycrystalline silicon.

13. The semiconductor device according to claim 2, wherein the semiconductor is polycrystalline silicon.

14. A semiconductor device comprising:
a semiconductor substrate; and
a memory cell array provided on the semiconductor substrate and including a plurality of memory cells arranged on the semiconductor substrate,
each of the plurality of the memory cells comprising:
a first insulating film provided on the semiconductor substrate;
a charge storage layer provided on the first insulating film;
a second insulating film provided on the charge storage layers; and
a control electrode provided on the charge storage layer via the second insulating film, the control electrode comprising first and second portions and both the first and second portions respectively contacting different portions of the second insulating film and directly contacting the different portions of the second insulating film, wherein the first portion comprises semiconductor and fails to contain metal or metal silicide, and the second portion forms directly next to the first portion and comprises metal or metal silicide and fails to contain semiconductor.

15. The semiconductor device according to claim 14, wherein the control electrode contains at least one of Co, Ni, Ti, Al, W, Cu and Pt.

16. The semiconductor device according to claim 14, wherein the first insulating film is a tunnel insulating film.

17. The semiconductor device according to claim 14, wherein the second insulating film is a high dielectric constant film having a dielectric constant higher than a silicon oxide film.

18. The semiconductor device according to claim 14, wherein a material of the second insulating film is oxide or nitride containing at least one of silicon, aluminum, magnesium, yttrium, hafnium, zirconium and lanthanum.

19. The semiconductor device according to claim 14, wherein the memory cell array is a memory cell array of a flash memory.

20. The semiconductor device according to claim 14, wherein the semiconductor is polycrystalline silicon.

* * * * *